United States Patent
Dutta et al.

(10) Patent No.: US 12,464,731 B2
(45) Date of Patent: Nov. 4, 2025

(54) LAYERED BOTTOM ELECTRODE DIELECTRIC FOR EMBEDDED MRAM

(71) Applicant: INTERNATIONAL BUSINESS MACHINES CORPORATION, Armonk, NY (US)

(72) Inventors: Ashim Dutta, Clifton Park, NY (US); Michael Rizzolo, Delmar, NY (US); Jon Slaughter, Slingerlands, NY (US); Chih-Chao Yang, Glenmont, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 810 days.

(21) Appl. No.: 17/644,098

(22) Filed: Dec. 14, 2021

(65) Prior Publication Data

US 2023/0189534 A1    Jun. 15, 2023

(51) Int. Cl.
   *H10B 61/00*    (2023.01)
   *H10N 50/01*    (2023.01)
   *H10N 50/80*    (2023.01)

(52) U.S. Cl.
   CPC .......... *H10B 61/00* (2023.02); *H10N 50/01* (2023.02); *H10N 50/80* (2023.02)

(58) Field of Classification Search
   CPC .................................. H10B 61/10; H10B 61/00
   See application file for complete search history.

(56) References Cited

U.S. PATENT DOCUMENTS

| | | |
|---|---|---|
| 8,962,349 B1 | 2/2015 | Chen |
| 9,178,144 B1 | 11/2015 | Sung |
| 9,343,659 B1 | 5/2016 | Lu |
| 9,614,143 B2 | 4/2017 | Lu |
| 9,859,357 B1 | 1/2018 | Deligianni |
| 10,096,769 B2 | 10/2018 | Bhosale |
| 10,283,249 B2 | 5/2019 | Deligianni |
| 2013/0119494 A1 | 5/2013 | Li |
| 2016/0365505 A1 | 12/2016 | Lu |
| 2018/0096771 A1 | 4/2018 | Deligianni |
| 2023/0061143 A1* | 3/2023 | Chen ............ H10B 61/00 |

FOREIGN PATENT DOCUMENTS

CN   111613719 B  *  9/2023  ............ H10B 61/22

OTHER PUBLICATIONS

S. M. Sze, et al, Physics of Semiconductor Devices, Third Edition, John Wiley & Sons, 2007, Appendix H (Year: 2007).*
Nadezhda Fainer, et al., Low-k dielectrics on base of silicon carbon nitride films, Surface & Coatings Technology 201 (2007) 9269-9274 (Year: 2007).*

* cited by examiner

*Primary Examiner* — Shih Tsun A Chou
(74) *Attorney, Agent, or Firm* — Jeffrey M. Ingalls

(57) ABSTRACT

An MRAM device is provided. The MRAM device includes a first dielectric cap layer formed on an underlying layer, a second dielectric cap layer formed on the first dielectric cap layer, the first dielectric cap layer including a lower-κ material than that of the second dielectric cap layer. The MRAM device also includes a bottom electrode contact (BEC) formed through the first dielectric cap layer and the second dielectric cap layer, an MRAM stack formed on the BEC, and wherein the second dielectric cap layer surrounds an upper portion of the BEC.

18 Claims, 15 Drawing Sheets

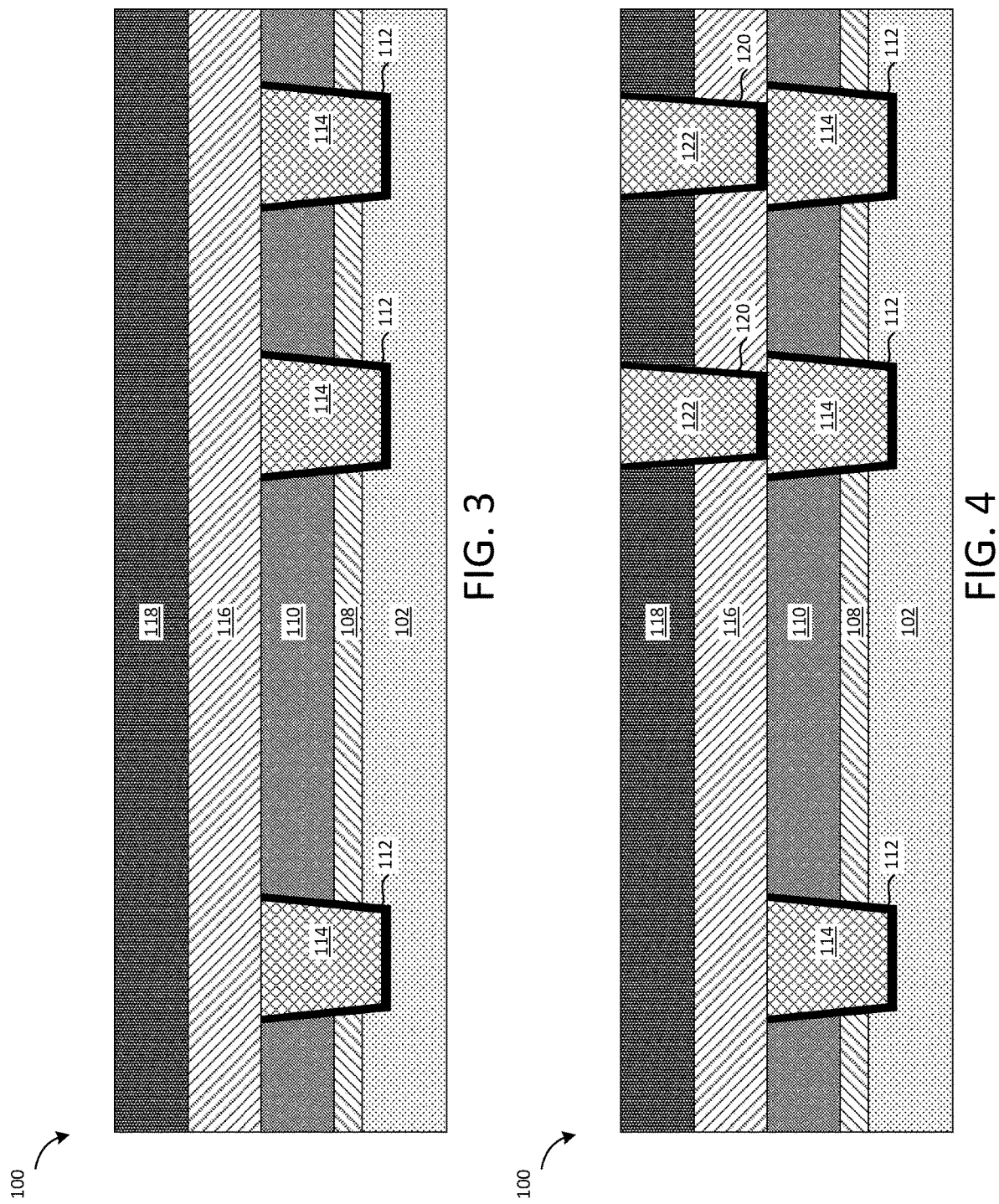

LAYERED BOTTOM ELECTRODE DIELECTRIC FOR EMBEDDED MRAM

BACKGROUND

The present disclosure relates to magnetic random access memory (MRAM) devices based on perpendicular magnetic tunnel junction (MTJ) structures. Certain MRAM devices may be fabricated to include and MTJ stack including a bottom electrode, an MRAM stack, and a top electrode. In general, MRAM devices may be used in a variety of applications. One example application is embedded storage (e.g., eFlash replacement). Another example is cache (e.g., embedded dynamic random-access memory (eDRAM), or static random-access memory (SRAM)). Certain MTJ structures include a Co-based synthetic anti-ferromagnet (SAF), a CoFeB-based reference layer, a MgO-based tunnel barrier, a CoFeB-based free layer, and cap layers containing, for example, Ta and/or Ru. Embedded MTJ structures are usually formed by subtractive patterning of blanket MTJ stacks into pillars between two metal levels.

A bottom electrode contact (BEC) may be formed beneath the MTJ pillar. Dielectric around the BEC may be included in certain embedded MRAM devices. In some devices that include this dielectric, the dielectric may be a carbon-based dielectric with a low-κ value to reduce overall logic area capacitance.

SUMMARY

Embodiments of the present disclosure relate to an MRAM device. The MRAM device includes a first dielectric cap layer formed on an underlying layer, a second dielectric cap layer formed on the first dielectric cap layer, the first dielectric cap layer including a lower-κ material than that of the second dielectric cap layer. The MRAM device also includes a bottom electrode contact (BEC) formed through the first dielectric cap layer and the second dielectric cap layer, an MRAM stack formed on the BEC, and wherein the second dielectric cap layer surrounds an upper portion of the BEC.

Other embodiments relate to a method of manufacturing a semiconductor device. The method includes forming a first dielectric cap layer on an underlying layer, forming a second dielectric cap layer on the first dielectric cap layer, the first dielectric cap layer including a lower-κ material than that of the second dielectric cap layer, and forming a bottom electrode contact (BEC) through the first dielectric cap layer and the second dielectric cap layer. The method also includes forming an MRAM stack on the BEC. The second dielectric cap layer surrounds an upper portion of the BEC.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

FIG. 3 is a cross-sectional view of the semiconductor device of FIG. 2 after additional fabrication operations, according to embodiments.

FIG. 4 is a cross-sectional view of the semiconductor device of FIG. 3 after additional fabrication operations, according to embodiments.

DETAILED DESCRIPTION

Figure 1:
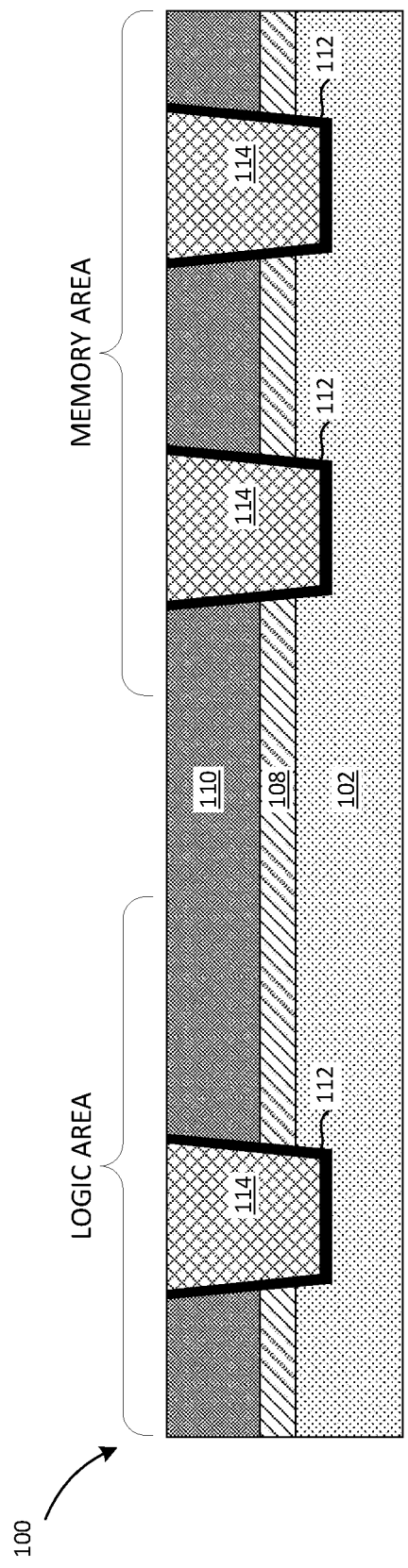
FIG. 1 is a cross-sectional view of a semiconductor device that includes an MRAM device including a bilayer dielectric surrounding the bottom electrode contact (BEC), at an intermediate stage of the manufacturing process, according to embodiments.

The present disclosure describes MRAM devices including magnetic tunnel junction ("MTJ") stacks and methods of manufacturing MUM devices. In particular, the present disclosure describes MRAM devices and methods of manufacturing same, the devices including a bilayer dielectric stack that is used to form the bottom electrode contact (BEC). The bottom layer of this bilayer stack consists of lower-κ dielectric, and the bottom layer may or may not have carbon. The top layer includes a carbon free dielectric which acts as a sacrificial layer for the logic area, and does not contribute to a capacitance increase of the MRAM device. The MRAM devices of the present embodiments, may help to improve the magnetic performance of the MRAM device by preventing degradation of the MRAM stack during ion beam etching (IBE). In some applications, a single layer of carbon free dielectric can be used around bottom electrode contact to prevent or reduce the previously mentioned MRAM device degradation.

In certain examples of MRAM devices, a carbon containing dielectric material may be used. However, during patterning of the MRAM device using IBE this dielectric is partially removed and redeposited (i.e., sputtering) on the sidewall of MTJ pillar. This redeposited dielectric may interact with the MTJ stack and degrade the magnetic performance of resulting MRAM device. However, the MRAM devices of the present embodiments having at least one layer of carbon free dielectric material, may help to improve the magnetic performance of the MRAM device by preventing degradation of the MRAM stack during ion beam etching (IBE). In some applications, a single layer of carbon free dielectric can be used around bottom electrode contact to prevent or reduce the previously mentioned MRAM device degradation.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, embedded DRAM (eDRAM) is a dynamic random-access memory (DRAM) integrated on the same die or multi-chip module (MCM) of an application-specific integrated circuit (ASIC) or microprocessor. eDRAM has been implemented in silicon-on-insulator (SOI) technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years. Magnetoresistive random-access memory (MRAM) devices using magnetic tunnel junctions (MTJ) are one option to replace existing eDRAM technologies. MRAM is a non-volatile memory, and this benefit is a driving factor that is accelerating the development of this memory technology.

A magnetic tunnel junction (MTJ) device, which is a primary storage element in a magnetic random access memory (MRAM), is a magnetic storage and switching device in which two ferromagnetic layers are separated by a thin insulating oxide layer (i.e., a tunnel barrier layer) to form a stacked structure. The tunnel barrier layer may comprise, for example, magnesium oxide or aluminum oxide. One of the ferromagnetic layers has a magnetization that is fixed, and it is therefore referred to as a magnetic fixed layer (or pinned layer, or reference layer). However, the other ferromagnetic layer has a magnetization that can change, and it is therefore referred to as a free layer (or magnetic free layer). When a bias is applied to the MTJ device, electrons that are spin polarized by the ferromagnetic layers traverse the insulating tunnel barrier layer through a process known as quantum tunneling to generate an electric current whose magnitude depends on an orientation of magnetization of the ferromagnetic layers. The MTJ device will exhibit a low resistance when a magnetic moment of the free layer is parallel to the fixed layer magnetic moment, and it will exhibit a high resistance when the magnetic moment of the free layer is oriented anti-parallel to the fixed layer magnetic moment.

The materials and geometries used to build the stack of different layers forming the MTJ device are factors that affect the characteristics of the device in terms of speed (i.e., switching time) and power consumption (e.g., voltage and/or current required to switch the device from one state to another). As discussed briefly above, certain MTJ devices have a pillar structure (i.e., a stack of materials) having a cylindrical shape, where current flows from a top layer to a bottom layer, or vice versa, in order to switch the magnetization of one ferromagnetic layer. These types of MTJ devices are generally referred to as spin transfer torque (STT) MTJ devices. Certain STT MRAM devices may have limited switching speed and endurance in comparison to static random access memory (SRAM) devices (i.e., random access memory that retains data bits in its memory as long as power is being supplied). Other types of MTJ devices are referred to as spin orbit torque (SOT) devices. In the SOT type of device, the stacked pillar structure is still cylindrically shaped, but the stack is deposited on top of a heavy metal conductor. In the SOT type of MTJ device, current flows horizontally in this conductor and switches the magnetization of the ferromagnetic layer at the interface.

In STT type MRAM devices, the manufacture of the devices is often performed in conjunction with forming middle-of-line (MOL) or back-end-of-line (BEOL) layers. This may be referred to as embedded MRAM, where the MRAM devices are embedded in, or formed in conjunction with these layers. In general, front-end-of-line (FEOL) refers to the set of process steps that form transistors and other circuit elements (such as resistors and capacitors) that are later connected electrically with middle-of-line (MOL) and back-end-of-line (BEOL) layers. In general, MOL refers to the set of wafer processing steps used to create the structures that provide the local electrical connections between transistors (e.g., gate contact formation). MOL processing generally occurs after FEOL processes and before BEOL processes. In general, the BEOL is the portion of IC fabrication where the individual devices (transistors, capacitors, resistors, etc.) are interconnected with wiring on the wafer.

As discussed above, MRAM devices may be useful for a variety of different applications, such as embedded storage and cache. For high performance MRAM devices based on perpendicular MTJ structures, the embedded MRAM device patterning using an ion beam etch (IBE) step may cause sputtering of the dielectric material (i.e., a phenomenon in which microscopic particles of a solid material are ejected from its surface, after the material is itself bombarded by energetic particles of a plasma or gas) and redeposition of the dielectric material on the MTJ sidewall. In other words, if the dielectric material contains carbon, the carbon from the dielectric layer may get sputtered to the sidewall of the MTJ pillar, which may cause electrical shorts or otherwise degrade the performance of the MRAM device. As such, it may be desirable to minimize any deposition of carbon on the MTJ stack during this manufacturing step. As discussed herein, the present embodiments may eliminate or reduce the potential for carbon sputtering on the MTJ stack by utilizing at least one carbon free dielectric layer.

Referring now to the drawings in which like numerals represent the same or similar elements and initially to FIG. 1, an exemplary method of manufacturing a semiconductor device 100 (i.e., an MRAM device) to which the present embodiments may be applied is shown. In certain examples, several back end of line ("BEOL") layers and front end of line (FEOL) layers may be formed. In general, the front-end-of-line (FEOL) is the first portion of IC fabrication where the individual devices (transistors, capacitors, resistors, etc.) are patterned in the semiconductor. FEOL generally covers everything up to (but not including) the deposition of metal interconnect layers. In general, the BEOL is the second portion of IC fabrication where the individual devices (transistors, capacitors, resistors, etc.) are interconnected with wiring on the wafer. The BEOL metal layers (not shown) can include, for example, Cu, TaN, Ta, Ti, TiN, or a combination thereof. A BEOL dielectric layer (not shown) may be formed on the sides of one or more of the BEOL metal layers. The BEOL dielectric layer may be composed of, for example, $SiO_x$, $SiN_x$, SiBCN, low-κ, NBLOK, or any other suitable dielectric material. The structure including the FEOL/BEOL layers may be a starting structure upon which the MRAM devices are formed.

As shown in the semiconductor device 100 of FIG. 1, an oxide layer 102 is provided as a base layer into which an interconnect structure of the semiconductor device 100 may be formed. The oxide layer 102 may include, for example, TEOS, low-κ or ultra-low-κ (ULK) etc. In certain embodiments, an interconnect structure (not shown) may be included in one of the BEOL layers. As shown in FIG. 1, a cap layer 108 (or dielectric cap layer) may be formed on the oxide layer 102. The cap layer 108 may be comprised of, for example, an NBLoK (SiCxNyHz) dielectric capping material. In certain examples, the cap layer 108 may comprise at least one of SiC, SiN, SiCN, hydrogen doped SiCN, etc.

As shown in FIG. 1, a first interlayer dielectric (ILD) layer 110 is then formed on the cap layer 108. The first ILD layer 110 may include, for example, an ultra-low-κ (ULK) material or any other suitable dielectric material(s). Vias are then formed (not shown in FIG. 1) into the first ILD layer 110, the cap layer 108 and at least partially into the oxide layer 102. Then, a bottom metal liner layer 112 and a bottom metal layer 114 are formed in the vias, as shown in FIG. 1. These layers may be included in one of the BEOL layers. In certain examples, the bottom metal liner layer 112 may include, W, WN, Ta, TaN, Ti, TiN, Ru, Al and other high melting point metals or conductive metal nitrides. In certain examples, the bottom metal layer 114 may include, for example, Cu, W, Co, Ru, Al, etc. As shown in FIG. 1, the MRAM device includes a logic area and the memory area adjacent to the logic area.

Figure 2:
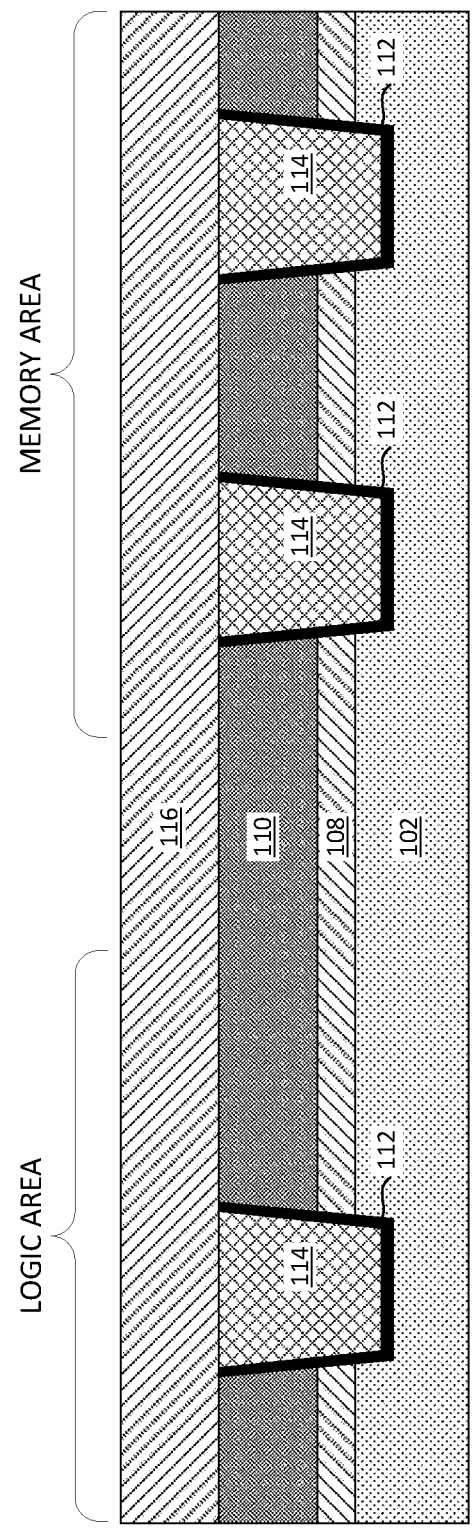
FIG. 2 is a cross-sectional view of the semiconductor device of FIG. 1 after additional fabrication operations, according to embodiments.

Referring now to FIG. 2, this figure is a cross-sectional view of the semiconductor device 100 including the MRAM of FIG. 1 after additional fabrication operations, according to embodiments. As shown in FIG. 2, a first dielectric cap layer 116 is formed on the first ILD layer 110 over the entire area of the semiconductor device 100. In certain embodiments, the first dielectric cap layer 116 may include at least one material selected from SiC, SiCNH or another suitable lower-κ dielectric cap material. In certain embodiments, this first dielectric cap layer 116 may include carbon. As shown in FIG. 2, the first dielectric cap layer 116 covers the entire surface of the semiconductor device 100 (i.e., it covers both the logic area and the memory area). Then, in certain embodiments, a CMP process may be utilized to planarize the surface of the first dielectric cap layer 116.

Referring now to FIG. 3, this figure is a cross-sectional view of the semiconductor device 100 including the MRAM of FIG. 2 after additional fabrication operations, according to embodiments. As shown in FIG. 3, a second dielectric cap layer 118 is formed over the entire semiconductor device 100. In certain examples, the second dielectric cap layer 118 includes at least one of SiN, SiO$_x$, hydrogen doped SiN, or any other suitable carbon-free dielectric cap material with higher density. Then, in certain embodiments, a CMP process may be utilized to planarize the surface of the second dielectric cap layer 118. Thus, as seen in FIG. 3, a bilayer dielectric cap layer including both the first dielectric cap layer 116 and the second dielectric cap layer 118 is formed. In certain embodiments, the second dielectric cap layer 118 has a truncated conical shape.

Referring now to FIG. 4, this figure is a cross-sectional view of the semiconductor device 100 including the MRAM of FIG. 3 after additional fabrication operations, according to embodiments. Vias are first formed in the first dielectric cap layer 116 and the second dielectric cap layer 118. Then, as shown in FIG. 4, a bottom electrode contact (BEC) liner layer 120 and a BEC 122 are formed in the vias. In certain examples, the BEC 122 has an inverse conical shape resulting from, for example, an additive damascene process. It should be appreciated that the BEC 122 may be patterned by any suitable combination of processing steps, including using lithography masks (e.g., a single layer or multilayer mask) to transfer the pattern, and then etching. Then, in certain embodiments, a CMP process may be utilized to planarize the upper surface of the semiconductor device 100.

Figure 5:
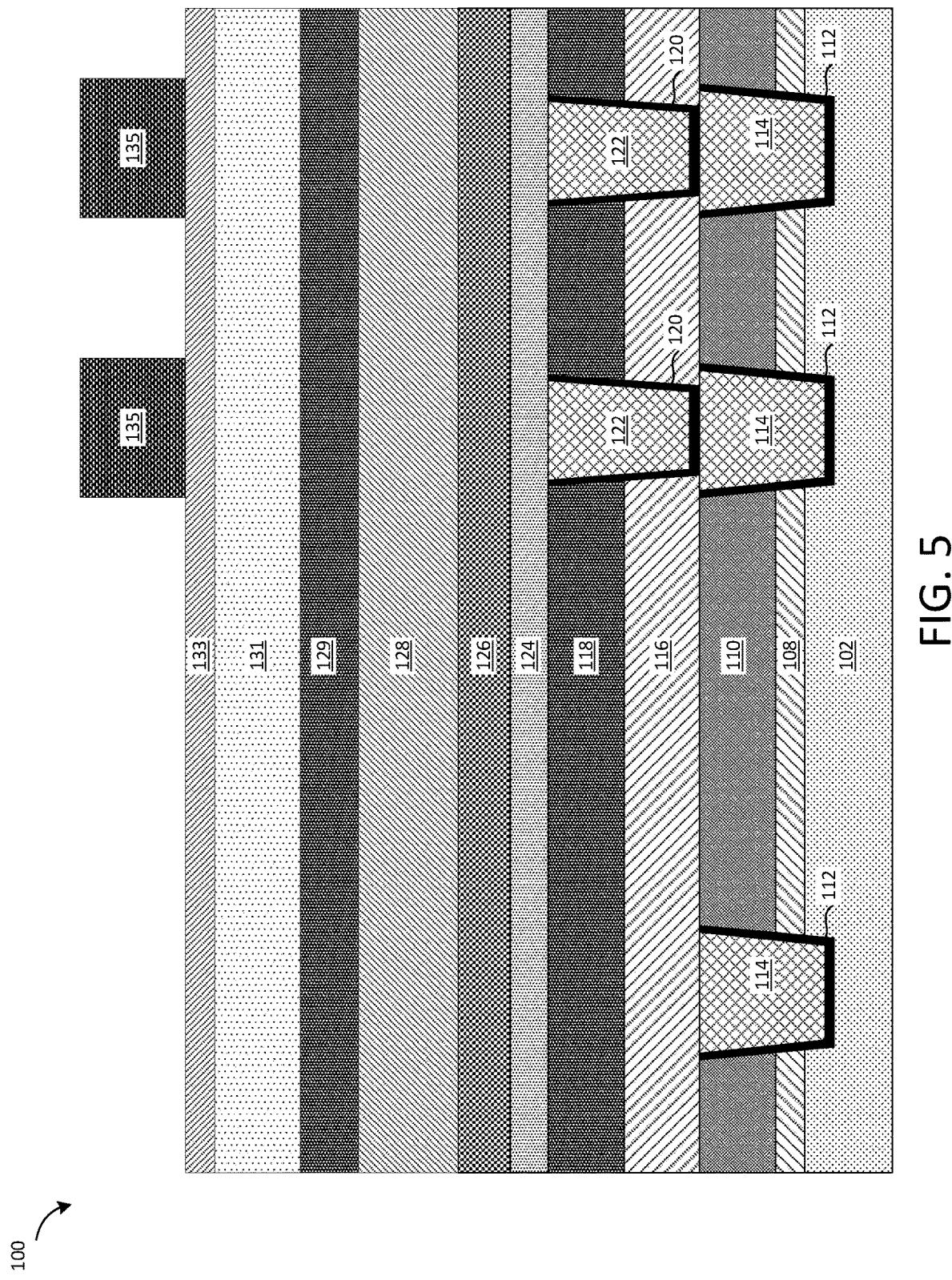
FIG. 5 is a cross-sectional view of the semiconductor device of FIG. 4 after additional fabrication operations, according to embodiments.

Referring now to FIG. 5, this figure is a cross-sectional view of the semiconductor device 100 including the MRAM of FIG. 4 after additional fabrication operations, according to embodiments. As shown in FIG. 5, an MRAM stack is formed on the upper surfaces of the BEC 122. The MRAM stack may include multiple layers such as, for example, multiple magnetic layers separated by an insulating layer. In certain embodiments, the MRAM stack includes a bottom electrode 124, an MTJ stack 126, and a top electrode 128. The bottom electrode 124 and top electrode 128 may include one or more of Nb, NbN, W, WN, Ta, TaN, Ti, TiN, Ru, Mo, Cr, V, Pd, Pt, Rh, Sc, Al and other high melting point metals or conductive metal nitrides, etc. In certain embodiments, the MTJ stack 126 includes a reference layer (not shown), a tunnel barrier layer (not shown), and a magnetic free layer (not shown). The reference layer (or fixed layer) may, for example, be annealed in a magnetic field to set a polarization state of the reference layer in the MTJ stack 126. The tunnel barrier layer is formed on the reference layer. Following the formation of the tunnel barrier layer, the magnetic free layer is formed on the tunnel barrier layer.

It should be appreciated that this MRAM stack structure is only an example, and any other suitable MRAM stack structure known to one of skill in the art may be utilized. It should also be appreciated that this example MRAM stack structure may include one or more additional layers, include intervening layers, and any of the layers described with respect to the MRAM stack structure may contain a plurality of sublayers.

Next, as shown in FIG. 5, a hardmask 129 (e.g., a dielectric hardmask) is formed on the top electrode 128. In certain embodiments, the hardmask 129 is a multilayer hardmask. At least initially, the hardmask 129 is formed over the entire semiconductor device 100 as a continuous layer. In certain examples, the material of the hardmask 129 may be TEOS or any other suitable material(s). For example, the hardmask 129 may include one or more of the following materials: TEOS, SiN, SiC, SiON, SiCN etc.

As also shown in FIG. 5, a lithographic mask is formed that may be used to pattern the MRAM stack. In this example, the lithographic mask is a tri-layer mask including an organic planarizing layer 131, a lithographic hardmask 133 (e.g., SiARC, SiN, SiON, etc.), and a photoresist 135. It should be appreciated that the lithographic hardmask 133 may include a plurality of layers. The photoresist 135 may be formed by patterning using any suitable lithographic process.

Figure 6:
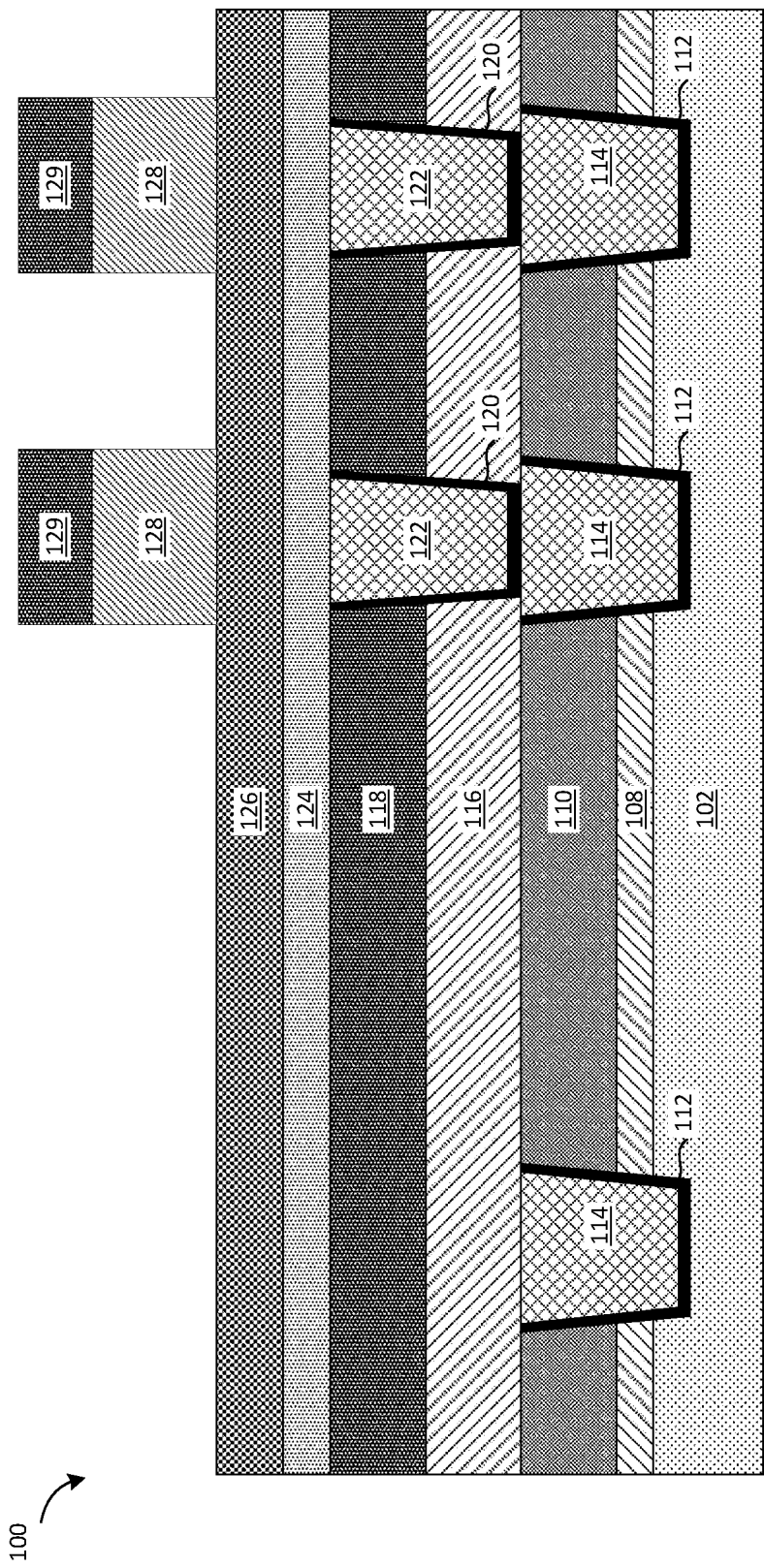
FIG. 6 is a cross-sectional view of the semiconductor device of FIG. 5 after additional fabrication operations, according to embodiments.
Figure 7:
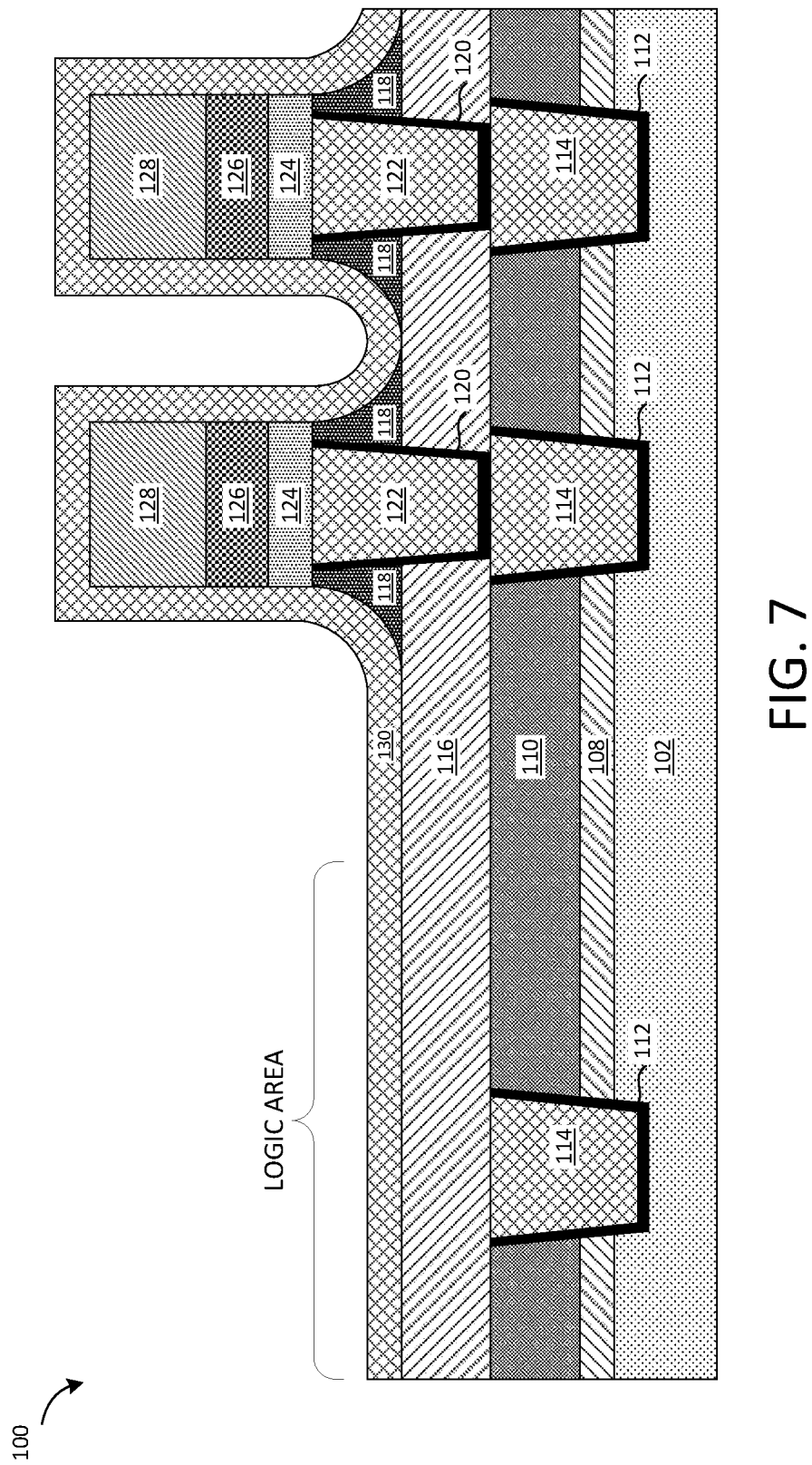
FIG. 7 is a cross-sectional view of the semiconductor device of FIG. 6 after additional fabrication operations, according to embodiments.

Referring now to FIGS. 6 and 7, these figures are cross-sectional views of the semiconductor device 100 including the MRAM of FIG. 5 after additional fabrication operations, according to embodiments. As shown in FIG. 6, the pattern of the photoresist 135 layer is transferred to just above the magnetic tunnel junction (MTJ) stack 126 (i.e., the reference layer, the tunnel barrier layer, and the magnetic free layer), which is etched to create the MTJ pillars. In one example, a two-step material removal process is used to form the MTJ pillars. In a first material removal step, RIE is used to remove the material down to the level of the top of the MTJ stack 126 (i.e., removing the material of the hardmask 129, the organic planarizing layer 131, and the lithographic hardmask 133. In a second material removal step as shown in FIG. 7, an IBE process is used to remove the material of the MTJ stack 126, the bottom electrode 124 and at least portions of the second dielectric cap layer 118. After the pattern of the photoresist 135 has been transferred to the create the MTJ pillars, the photoresist 135, the lithographic hardmask 133, the organic planarization layer 131 and the hardmask 129 are removed using, for example, an ashing process. The IBE etching process is a non-selective etching operation, so the dielectric material of the second dielectric cap layer 118 is removed in such a way as to create a gouged sidewall profile (or slanted, or curved shaped profile).

As shown in FIG. 7, the material of the second dielectric cap layer 118 is completely removed in the logic area, thus exposing the carbon-based first dielectric cap layer 116 in that area. However, the carbon-free second dielectric cap layer 118 remains to surround an upper portion of the BEC 122. It should be appreciated that when using the IBE etching process, there is no portion of the BEC 122 that is exposed. Therefore, to the extent that there is any sputtering of material during IBE, it is only (or mostly) the dielectric material of the carbon-free second dielectric cap layer 118 that may be deposited on the sidewalls of the MTJ stack 126. Due to the minimal IBE etching (or no etching) of the first dielectric cap layer 116, there is little to no effect of sputtering (i.e., carbon from the first dielectric cap layer 116 accumulating on the MTJ stack 126). Accordingly, in the present embodiments, there may be a benefit of reducing the occurrence of electrical shorts on the MTJ stack 126.

As shown in FIG. 7, a dielectric encapsulation layer 130 is formed over the entire semiconductor device 100. The dielectric encapsulation layer 130 may include, for example, SiN or SiCN(H), or any other suitable dielectric material. One purpose of the dielectric encapsulation layer 130 is to isolate the tunnel barrier layer of the MTJ stack 126 from the outside environment.

Figure 8:
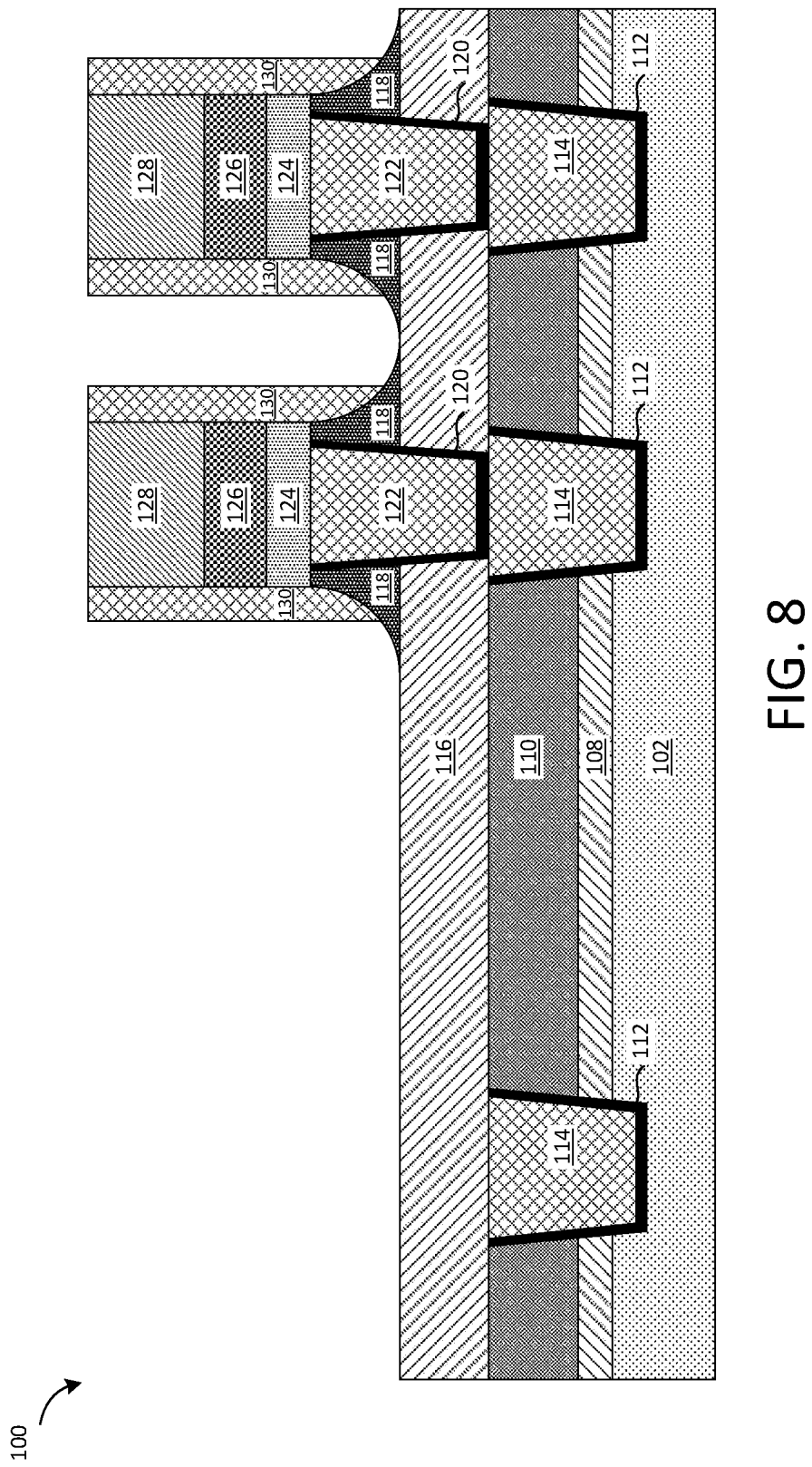
FIG. 8 is a cross-sectional view of the semiconductor device of FIG. 7 after additional fabrication operations, according to embodiments.

Referring now to FIG. 8, this figure is a cross-sectional view of the semiconductor device 100 including the MRAM of FIG. 7 after additional fabrication operations, according to embodiments. As shown in FIG. 8, an isotropic etching process is performed on the dielectric encapsulation layer 130 to remove the horizontal portions thereof. In other words, the dielectric encapsulation layer 130 only remains on the vertical sidewalls of the MTJ stack 126, bottom electrode 124 and top electrode 128. This material removal process also exposes the first dielectric cap layer 116 in the logic area of the device.

Figure 9:
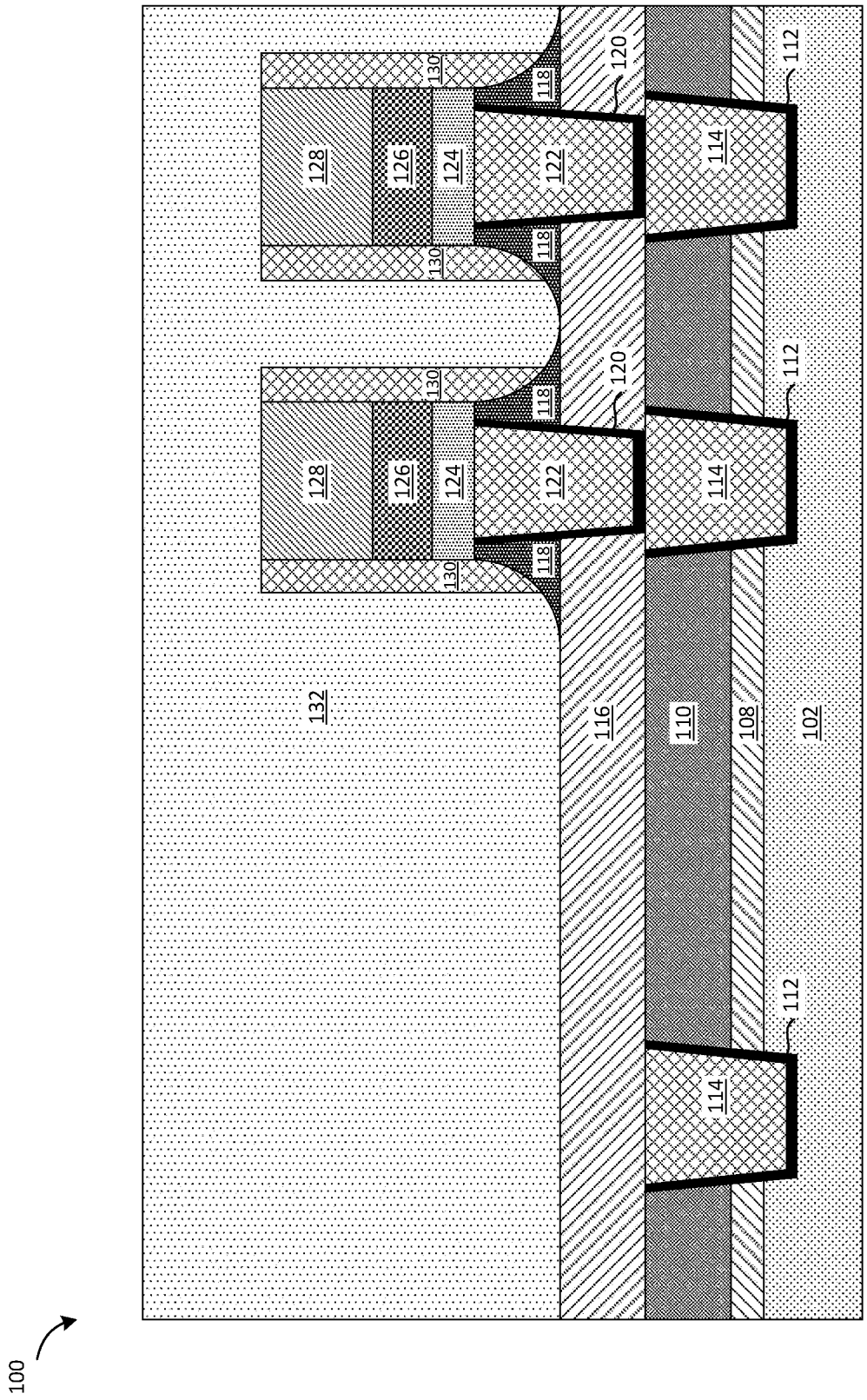
FIG. 9 is a cross-sectional view of the semiconductor device of FIG. 8 after additional fabrication operations, according to embodiments.

Referring now to FIG. 9, this figure is a cross-sectional view of the semiconductor device 100 including the MRAM of FIG. 8 after additional fabrication operations, according to embodiments. As shown in FIG. 9, a dielectric fill layer 132 is formed in and around the MTJ pillars. In certain examples, the formation of the dielectric fill layer 132 may be an oxide based dielectric material that may be formed by an aggressive deposition process. Thus, the dielectric encapsulation layer 130 may help protect the tunnel barrier layer from damage during such a process.

Figure 10:
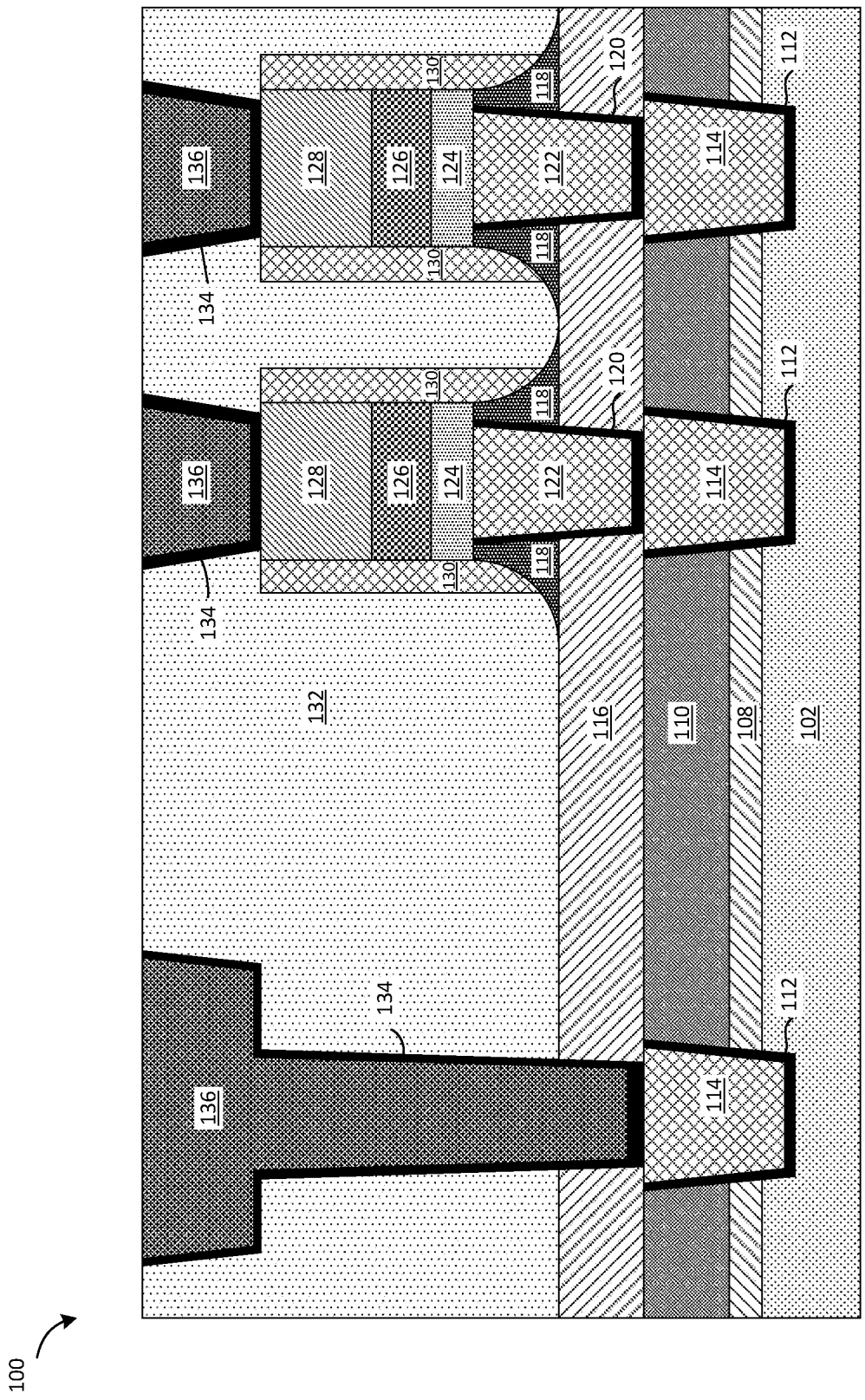
FIG. 10 is a cross-sectional view of the semiconductor device of FIG. 9 after additional fabrication operations, according to embodiments.

Then, as shown in FIG. 10, vias are formed in the logic area and memory area by any suitable combination of processes that are known to a person of skill in the art. A top contact liner layer 134 may first be formed in the vias. Then, a first top contact 136 is formed in the via in the logic area of the semiconductor device 100, and a second top contact 136 is formed in the via in the memory area.

Figure 11:
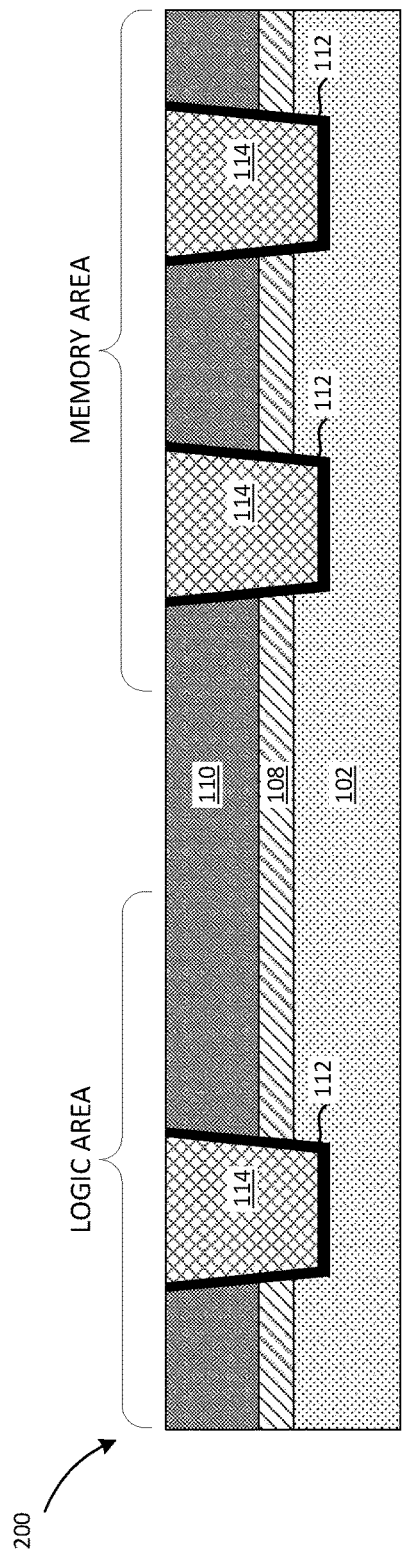
FIG. 11 is a cross-sectional view of a semiconductor device that includes an MRAM device including a carbon free dielectric surrounding the BEC at an intermediate stage of the manufacturing process, according to embodiments.

Referring now to FIG. 11, an exemplary method of manufacturing a semiconductor device 200 (i.e., an MRAM device) to which the present embodiments may be applied is shown. The embodiments shown in FIGS. 11-18 are similar in certain respects to the MRAM devices shown in FIGS. 1-10, however the structure of the dielectric cap layer is different. In certain examples, several back end of line ("BEOL") layers and front end of line (FEOL) layers may be formed. In general, the front-end-of-line (FEOL) is the first portion of IC fabrication where the individual devices (transistors, capacitors, resistors, etc.) are patterned in the semiconductor. FEOL generally covers everything up to (but not including) the deposition of metal interconnect layers. In general, the BEOL is the second portion of IC fabrication where the individual devices (transistors, capacitors, resistors, etc.) are interconnected with wiring on the wafer. The BEOL metal layers (not shown) can include, for example, Cu, TaN, Ta, Ti, TiN, or a combination thereof. A BEOL dielectric layer (not shown) may be formed on the sides of one or more of the BEOL metal layers. The BEOL dielectric layer may be composed of, for example, $SiO_x$, $SiN_x$, SiBCN, low-κ, NBLOK, or any other suitable dielectric material. The structure including the FEOL/BEOL layers may be a starting structure upon which the MRAM devices are formed.

As shown in the semiconductor device 200 of FIG. 11, an oxide layer 102 is provided as a base layer into which an interconnect structure of the semiconductor device 200 may be formed. The oxide layer 102 may include, for example, TEOS, low-κ or ultra-low-κ (ULK) etc. In certain embodiments, a via interconnect structure may be included in one of the BEOL layers. As shown in FIG. 11, a cap layer 108 (or dielectric cap layer) may be formed on the oxide layer 102. The cap layer 108 may be comprised of, for example, an NBLoK (SiCxNyHz) dielectric capping material. In certain examples, the cap layer 108 may comprise at least one of SiC, SiN, SiCN, hydrogen doped SiCN, etc.

As shown in FIG. 11, a first interlayer dielectric (ILD) layer 110 is then formed on the cap layer 108. The first ILD layer 110 may include, for example, an ultra-low-κ (ULK) material or any other suitable dielectric material(s). Vias are then formed (not shown in FIG. 11) into the first ILD layer 110, the cap layer 108 and at least partially into the oxide layer 102. In the memory area, as shown in FIG. 11, these vias expose the combined via interconnect structure (e.g., a metal liner layer 104 and a metal layer 106). Then, a bottom metal liner layer 112 and a bottom metal layer 114 are formed in the vias, as shown in FIG. 11. These layers may be included in one of the BEOL layers. In certain examples, the bottom metal liner layer 112 may include, W, WN, Ta, TaN, Ti, TiN, Ru, Al and other high melting point metals or conductive metal nitrides. In certain examples, the bottom metal layer 114 may include, for example, Cu, W, Co, Ru, Al, etc. As shown in FIG. 11, the MRAM device includes a logic area and the memory area adjacent to the logic area.

Figure 12:
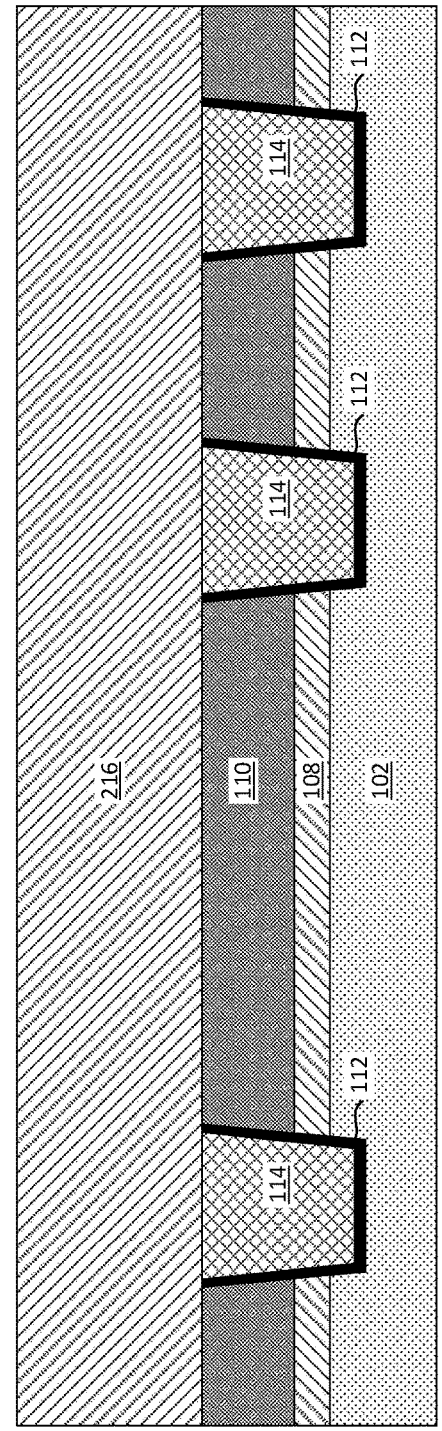
FIG. 12 is a cross-sectional view of the semiconductor device of FIG. 11 after additional fabrication operations, according to embodiments.

Referring now to FIG. 12, this figure is a cross-sectional view of the semiconductor device 200 including the MRAM of FIG. 11 after additional fabrication operations, according to embodiments. As shown in FIG. 12, a dielectric cap layer 216 is formed on the first ILD layer 110 over the entire semiconductor device 200. In certain embodiments, a CMP process may be utilized to planarize the surface of the dielectric cap layer 116. In certain examples, the dielectric cap layer 116 includes at least one of SiN, $SiO_x$, hydrogen doped SiN, or any other suitable carbon-free dielectric cap material with higher density. In certain examples, the height (or thickness) of the dielectric cap layer 116 may be about the same as the total thickness of the first dielectric cap layer 116 and the second dielectric cap layer 118 shown in FIG. 3.

Figure 13:
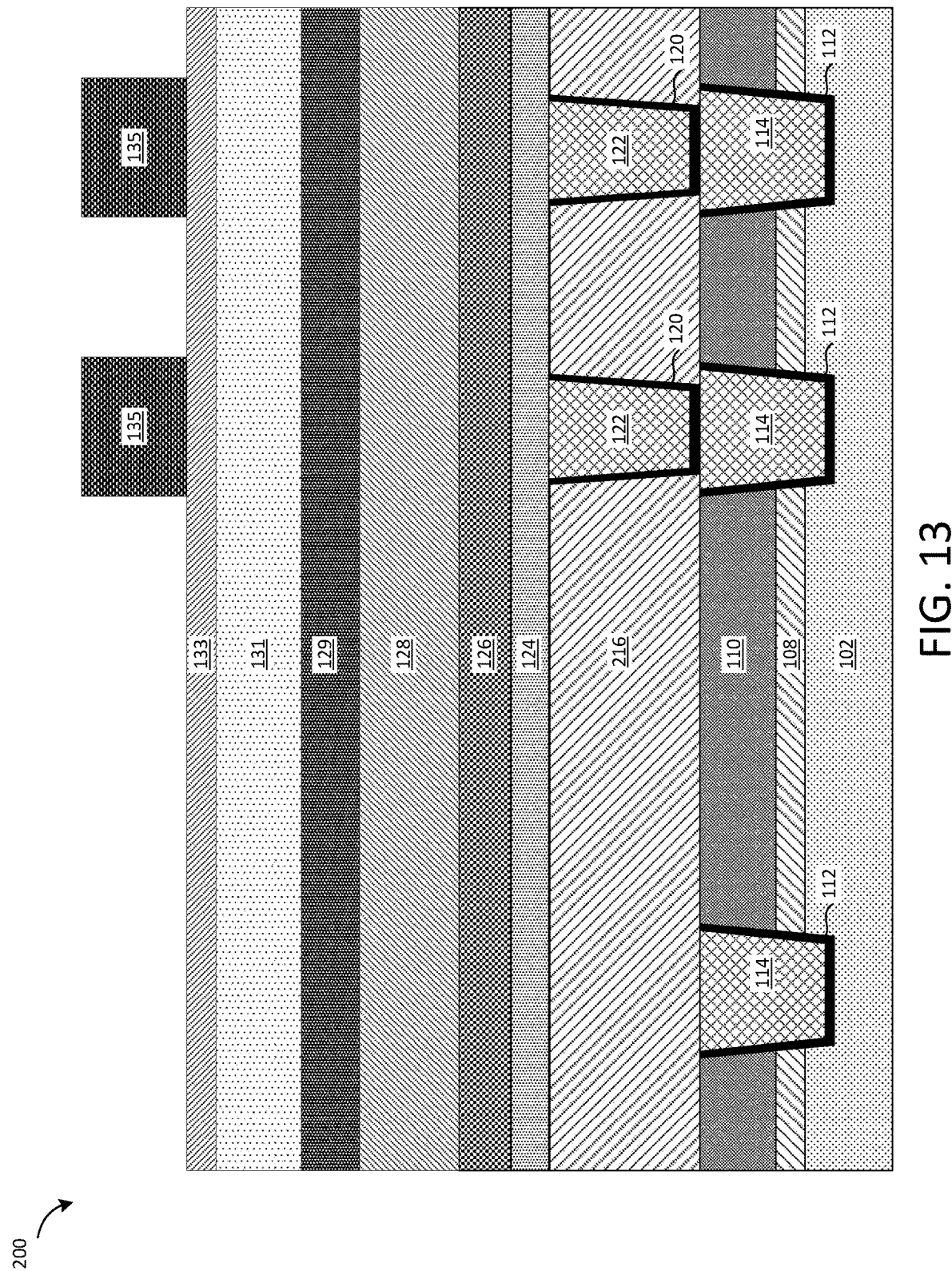
FIG. 13 is a cross-sectional view of the semiconductor device of FIG. 12 after additional fabrication operations, according to embodiments.

Referring now to FIG. 13, this figure is a cross-sectional view of the semiconductor device 200 including the MRAM of FIG. 12 after additional fabrication operations, according to embodiments. Vias are first formed in the dielectric cap layer 216. Then, as shown in FIG. 13, a bottom electrode contact (BEC) liner layer 120 and a BEC 122 are formed in the vias. In certain examples, the BEC 122 has an inverse conical shape resulting from, for example, an additive damascene process. It should be appreciated that the BEC 122 may be patterned by any suitable combination of processing steps, including using lithography masks (e.g., a single layer or multilayer mask) to transfer the pattern, and then etching. Then, in certain embodiments, a CMP process may be utilized to planarize the upper surface of the semiconductor device 200.

As shown in FIG. 13, an MRAM stack is formed on the upper surfaces of the BEC 122. The MRAM stack may include multiple layers such as, for example, multiple magnetic layers separated by an insulating layer. In certain embodiments, the MRAM stack includes a bottom electrode 124, an MTJ stack 126, and a top electrode 128. The bottom electrode 124 and top electrode 128 may include one or more of Nb, NbN, W, WN, Ta, TaN, Ti, TiN, Ru, Mo, Cr, V, Pd, Pt, Rh, Sc, Al and other high melting point metals or conductive metal nitrides, etc. In certain embodiments, the MTJ stack 126 includes a reference layer (not shown), a tunnel barrier layer (not shown), and a magnetic free layer (not shown). The reference layer (or fixed layer) may, for example, be annealed in a magnetic field to set a polarization state of the reference layer in the MTJ stack 126. The tunnel barrier layer is formed on the reference layer. Following the formation of the tunnel barrier layer, the magnetic free layer is formed on the tunnel barrier layer.

It should be appreciated that this MRAM stack structure is only an example, and any other suitable MRAM stack structure known to one of skill in the art may be utilized. It should also be appreciated that this example MRAM stack structure may include one or more additional layers, include intervening layers, and any of the layers described with respect to the MRAM stack structure may contain a plurality of sublayers.

Next, as shown in FIG. 13, a hardmask 129 (e.g., a dielectric hardmask) is formed on the top electrode 128. In certain embodiments, the hardmask 129 is a multilayer hardmask. At least initially, the hardmask 129 is formed over the entire semiconductor device 200 as a continuous layer. In certain examples, the material of the hardmask 129 may be TEOS or any other suitable material(s). For example, the hardmask 129 may include one or more of the following materials: TEOS, SiN, SiC, SiON, SiCN etc.

As also shown in FIG. 13, a lithographic mask is formed that may be used to pattern the MRAM stack. In this example, the lithographic mask is a tri-layer mask including an organic planarizing layer 131, a lithographic hardmask 133 (e.g., SiARC, SiN, SiON, etc.), and a photoresist 135. It should be appreciated that the lithographic hardmask 133 may include a plurality of layers. The photoresist 135 may be formed by patterning using any suitable lithographic process.

Figure 14:
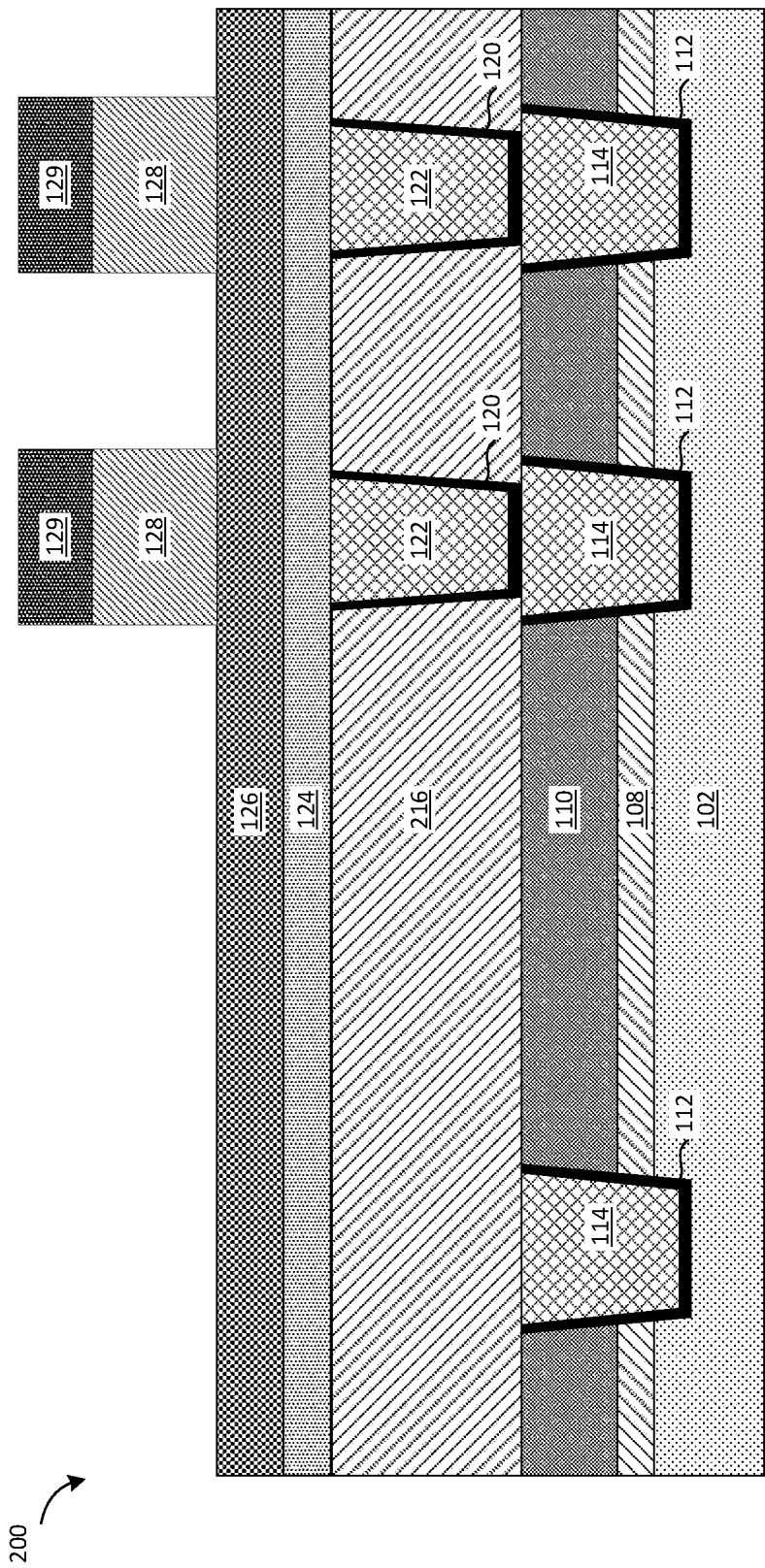
FIG. 14 is a cross-sectional view of the semiconductor device of FIG. 13 after additional fabrication operations, according to embodiments.
Figure 15:
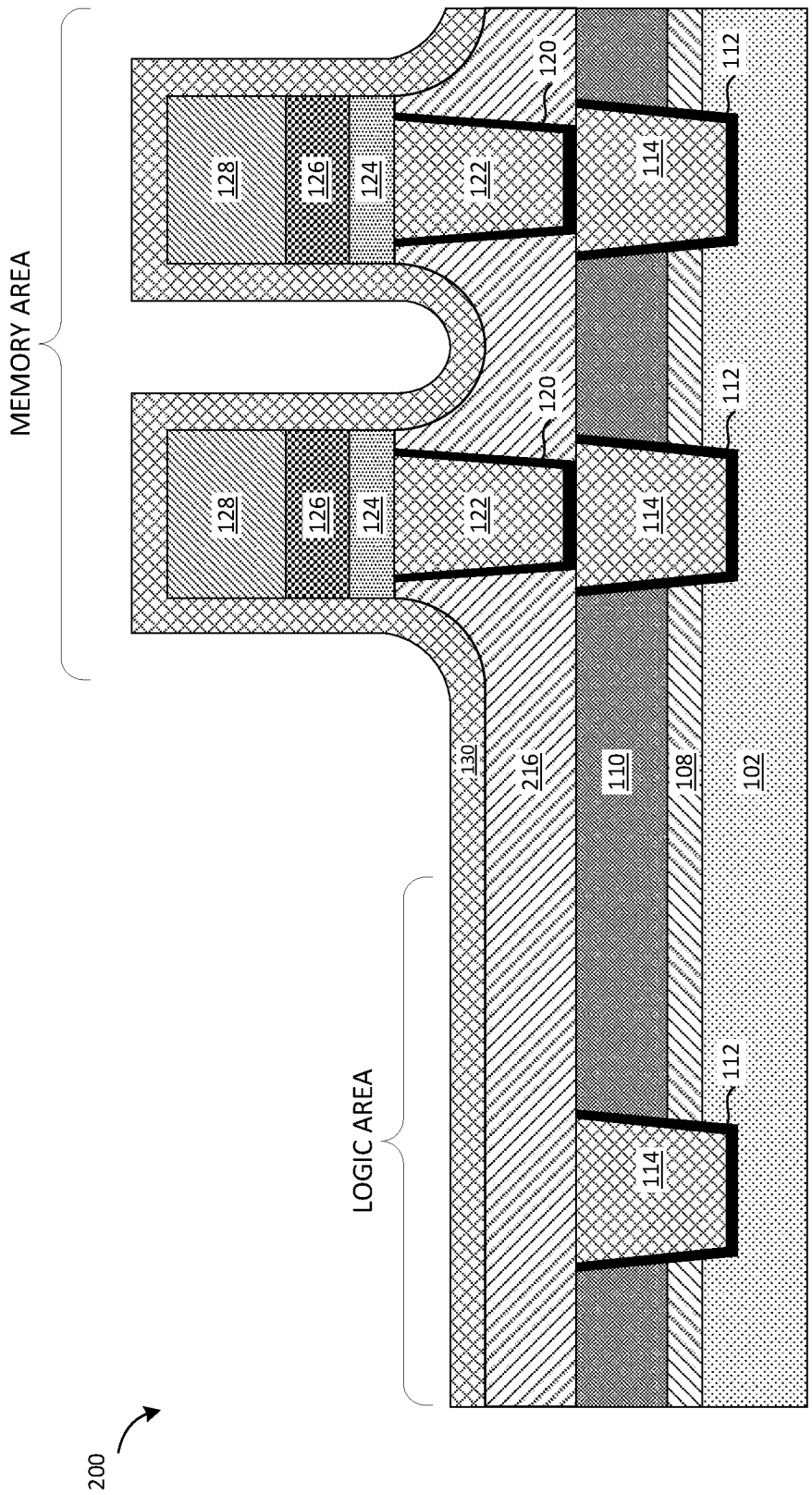
FIG. 15 is a cross-sectional view of the semiconductor device of FIG. 14 after additional fabrication operations, according to embodiments.

Referring now to FIGS. 14 and 15, these figures are cross-sectional views of the semiconductor device 200 including the MRAM of FIG. 13 after additional fabrication operations, according to embodiments. As shown in FIG. 14, the pattern of the photoresist 135 layer is transferred to just above the magnetic tunnel junction (MTJ) stack 126 (i.e., the reference layer, the tunnel barrier layer, and the magnetic free layer), which is etched to create the MTJ pillars. In one example, a two-step material removal process is used to form the MTJ pillars. In a first material removal step, RIE is used to remove the material down to the level of the top of the MTJ stack 126 (i.e., removing the material of the hardmask 129, the organic planarizing layer 131, and the lithographic hardmask 133. In a second material removal step as shown in FIG. 15, an IBE process is used to remove the material of the MTJ stack 126, the bottom electrode 124 and at least portions of the dielectric cap layer 216. After the pattern of the photoresist 135 has been transferred to the create the MTJ pillars, the photoresist 135, the lithographic hardmask 133, the organic planarization layer 131 and the hardmask 129 are removed using, for example, an ashing process. The IBE etching process is a non-selective etching operation, so the dielectric material of the dielectric cap layer 116 is removed in such a way as to create a gouged sidewall profile (or slanted, or curved shaped profile). As also shown in FIG. 15, not all of the dielectric cap layer 216 is removed, and a certain thickness of this layer still exists in the logic area of the semiconductor device 200.

As shown in FIG. 15, the carbon-free dielectric cap layer 116 remains to surround an upper portion of the BEC 122. It should be appreciated that when using the IBE etching process, there is no portion of the BEC 122 that is exposed. Therefore, to the extent that there is any sputtering of material during IBE, it is only the dielectric material of the carbon-free dielectric cap layer 116 that may be deposited on the sidewalls of the MTJ stack 126. Accordingly, in the present embodiments, there may be a benefit of reducing the occurrence of electrical shorts on the MTJ stack 126.

As shown in FIG. 15, a dielectric encapsulation layer 130 is formed over the entire semiconductor device 200. The dielectric encapsulation layer 130 may include, for example, SiN or SiCN(H), or any other suitable dielectric material. One purpose of the dielectric encapsulation layer 130 is to isolate the tunnel barrier layer of the MTJ stack 126 from the outside environment.

Figure 16:
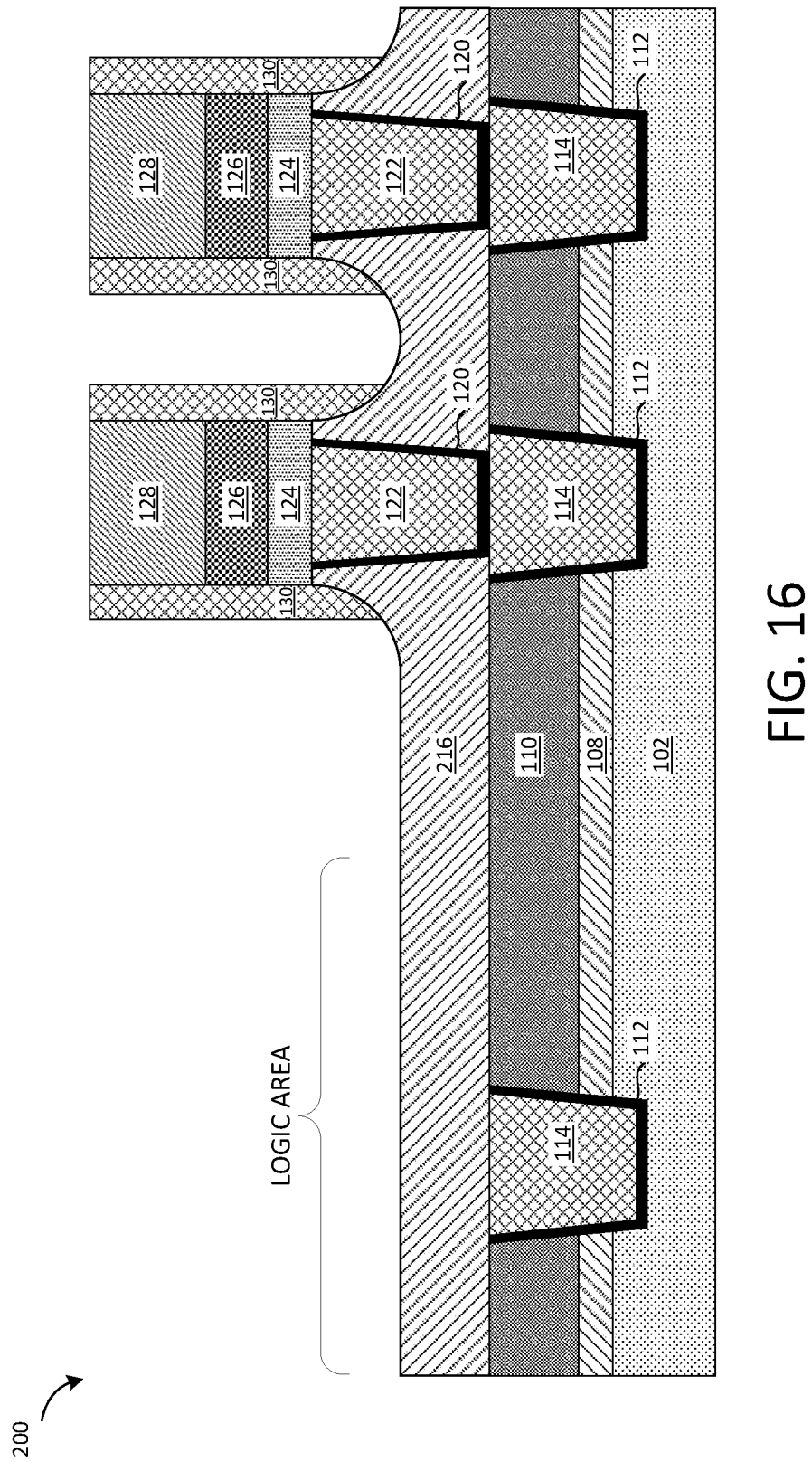
FIG. 16 is a cross-sectional view of the semiconductor device of FIG. 15 after additional fabrication operations, according to embodiments.

Referring now to FIG. 16, this figure is a cross-sectional view of the semiconductor device 200 including the MRAM of FIG. 15 after additional fabrication operations, according to embodiments. As shown in FIG. 16, an isotropic etching process is performed on the dielectric encapsulation layer 130 to remove the horizontal portions thereof. In other words, the dielectric encapsulation layer 130 remains on the vertical sidewalls of the MTJ stack 126, bottom electrode 124 and top electrode 128 (and on certain non-horizontal portions of the dielectric cap layer 216. This material removal process also exposes the dielectric cap layer 216 in the logic area of the device.

Figure 17:
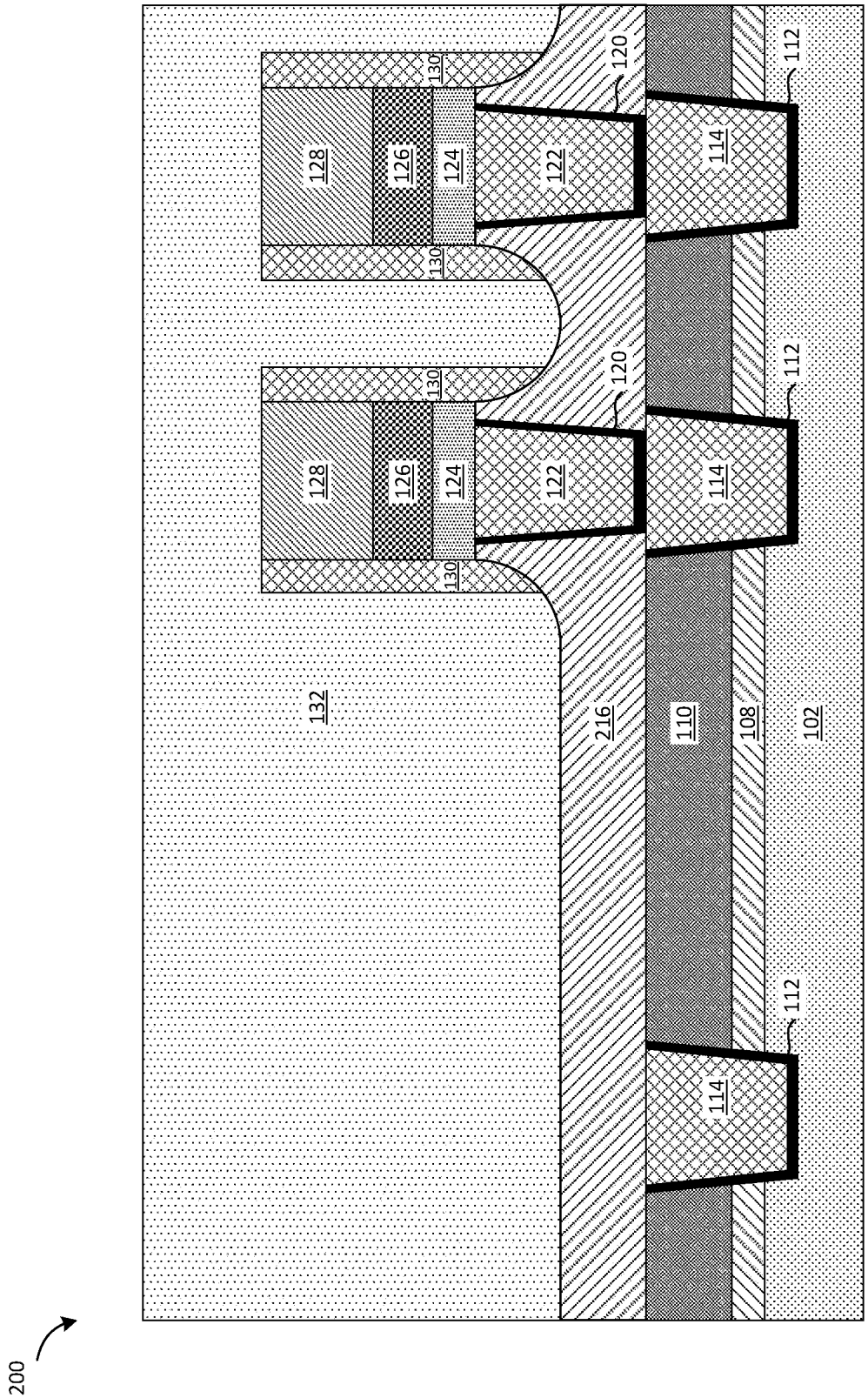
FIG. 17 is a cross-sectional view of the semiconductor device of FIG. 16 after additional fabrication operations, according to embodiments.
Figure 18:
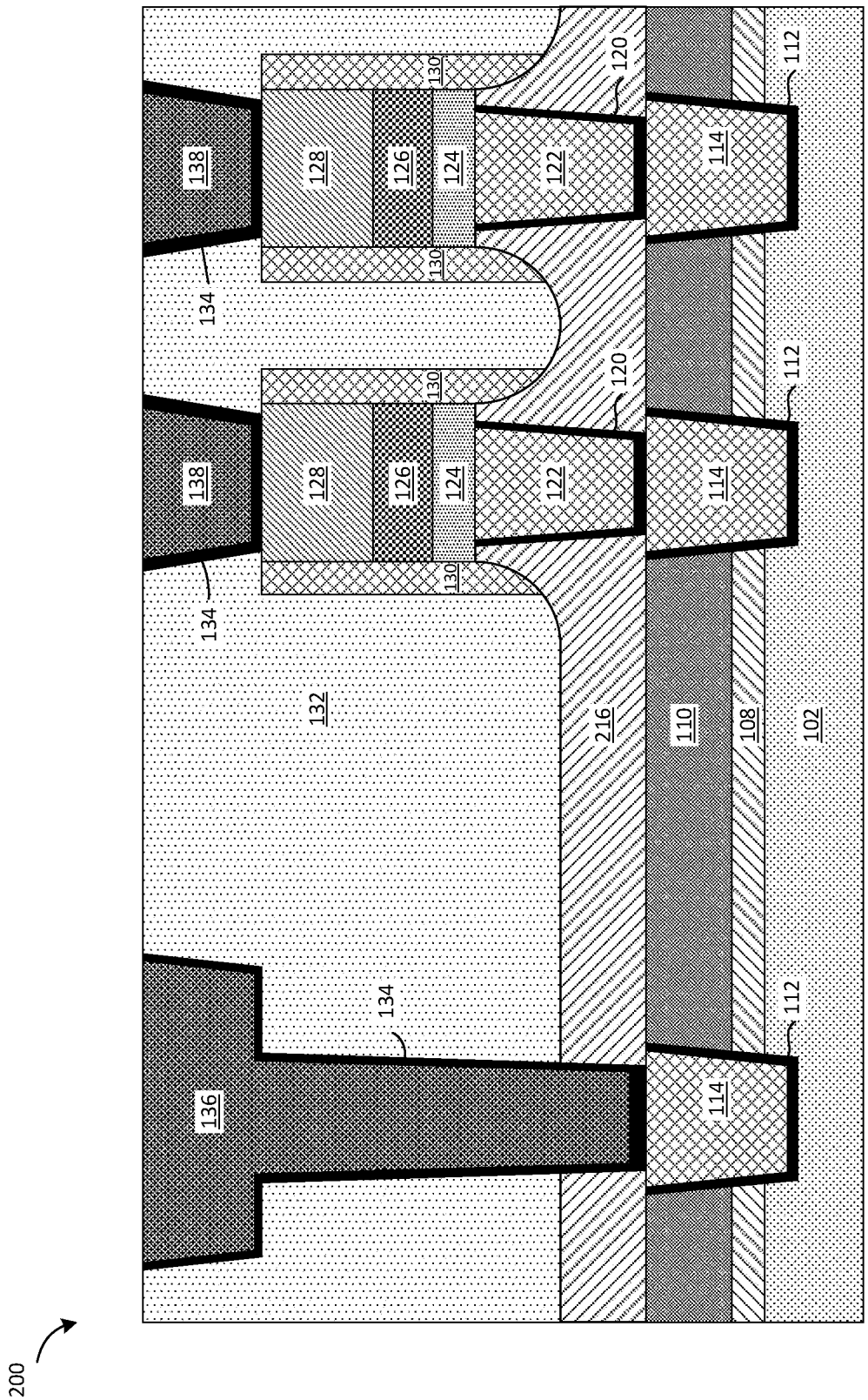
FIG. 18 is a cross-sectional view of a semiconductor device that includes an MRAM device at an intermediate stage of the manufacturing process, according to embodiments.

Referring now to FIG. 17, this figure is a cross-sectional view of the semiconductor device 200 including the MRAM of FIG. 16 after additional fabrication operations, according to embodiments. As shown in FIG. 17, a dielectric fill layer 132 is formed in and around the MTJ pillars. In certain examples, the formation of the dielectric fill layer 132 may be an oxide based dielectric material that may be formed by an aggressive deposition process. Thus, the dielectric encapsulation layer 130 may help protect the tunnel barrier layer from damage during such a process. Then, as shown in FIG. 18, vias are formed in the logic area and memory area by any suitable combination of processes that are known to a person of skill in the art. A top contact liner layer 134 may first be formed in the vias. Then, a first top contact 136 is formed in the via in the logic area of the semiconductor device 100, and a second top contact 138 is formed in the vias in the memory area.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a semiconductor device including a logic area and a memory area, the method comprising:
    forming a first dielectric cap layer on an underlying layer in both the logic area and the memory area;
    forming a second dielectric cap layer on the first dielectric cap layer only in the memory area, the first dielectric cap layer including a lower-K material than that of the second dielectric cap layer;
    forming a bottom electrode contact (BEC) through the first dielectric cap layer and the second dielectric cap layer;
    forming an MRAM stack on the BEC;
    wherein the second dielectric cap layer surrounds an upper portion of the BEC.

2. The method according to claim 1, wherein the first dielectric cap layer includes carbon.

3. The method according to claim 1, wherein forming the second dielectric cap layer includes etching away portions of the second dielectric cap layer so that no material of the second dielectric cap layer remains in a logic area of the semiconductor device.

4. The method according to claim 1, wherein the second dielectric cap layer is carbon-free.

5. The method according to claim 1, wherein the second dielectric cap layer has a truncated conical shape having curved sidewalls.

6. The method according to claim 1,
    wherein a width of an upper portion of the BEC is less than a width of a lower portion of the MRAM stack.

7. The method according to claim 1, wherein the BEC layer has an inverted truncated conical shape.

8. The method according to claim 1, wherein the MRAM stack includes a bottom electrode, an MTJ stack, and a top electrode.

9. The method according to claim 1, further comprising forming an interlayer dielectric around the MRAM stack, and forming a top electrode contact on the MRAM stack.

10. A semiconductor device including a logic area and a memory area the semiconductor device comprising:
    a first dielectric cap layer formed on an underlying layer in both the logic area and the memory area;
    a second dielectric cap layer formed on the first dielectric cap layer only in the memory area, the first dielectric cap layer including a lower-k material than that of the second dielectric cap layer;
    a bottom electrode contact (BEC) formed through the first dielectric cap layer and the second dielectric cap layer;
    an MRAM stack formed on the BEC;
    wherein the second dielectric cap layer surrounds an upper portion of the BEC.

11. The semiconductor device according to claim 10, wherein the first dielectric cap layer includes carbon.

12. The semiconductor device according to claim 10, wherein the second dielectric cap layer surrounds an upper portion of the BEC.

13. The semiconductor device according to claim 10, wherein the second dielectric cap layer is carbon-free.

14. The semiconductor device according to claim 10, wherein the second dielectric cap layer has a truncated conical shape having curved sidewalls.

15. The semiconductor device according to claim 10,
    wherein a width of an upper portion of the BEC layer is less than a width of a lower portion of the MRAM stack.

16. The semiconductor device according to claim 10, wherein the BEC has an inverted truncated conical shape.

17. The semiconductor device according to claim 10, wherein the MRAM stack includes a bottom electrode, an MTJ stack, and a top electrode.

18. The semiconductor device according to claim 10, further comprising an interlayer dielectric formed around the MRAM stack, and forming a top electrode contact on the MRAM stack.

* * * * *